United States Patent [19]
Wu et al.

[11] Patent Number: 5,592,114
[45] Date of Patent: Jan. 7, 1997

[54] TRUE TYPE SINGLE-PHASE SHIFT CIRCUIT

[75] Inventors: Chung-Yu Wu, Hsinchu; Shu-Yuan Chin, Tao-Yuan, both of Taiwan

[73] Assignee: National Science Counsil, Taipei, Taiwan

[21] Appl. No.: 275,172

[22] Filed: Jul. 14, 1994

[51] Int. Cl.[6] .................................................. H03K 3/353
[52] U.S. Cl. ...................... 327/208; 327/332; 327/288
[58] Field of Search .................................. 327/199, 208, 327/211, 212, 218, 393, 394, 312, 316, 323, 332, 277, 284, 285, 288, 264, 206; 326/113, 121, 58

[56] References Cited

U.S. PATENT DOCUMENTS

| | | | |
|---|---|---|---|
| 3,937,982 | 2/1976 | Nakajima | 307/205 |
| 4,568,842 | 2/1986 | Koike | 307/279 |
| 5,311,070 | 5/1994 | Dooley | 307/279 |

*Primary Examiner*—Timothy P. Callahan
*Assistant Examiner*—Eunja Shin
*Attorney, Agent, or Firm*—Townsend and Townsend and Crew LLP

[57] ABSTRACT

A true type single-phase shift circuit including a pair of PMOS transistors, a pair of NMOS transistors, a pair of first-type MOS transistors and one second-type transistor. The source terminals of the two PMOS transistors are both coupled to a first electric potential, the gate terminal of one PMOS transistor is coupled to a data signal, and the gate terminal of the second PMOS transistor is connected between the two first-type MOS transistors. The source terminals of the two NMOS transistors are both coupled to a second electric potential; the gate terminal of one NMOS transitors is coupled to the data signal and the gate of the second NMOS transistor is connected between the two first-type MOS transistors. The two first type MOS transistors are serially connected between the drain terminals of one of the two PMOS transistors and the drain terminal of one of the two NMOS transistors. Each gate terminal of the two first type MOS transistors is coupled to a clock pulse signal. The second-type MOS transistor is serially connected between the drain terminal of the other PMOS transistor and the drain terminal of the other NMOS transistor. The gate terminal of the second type MOS transistor is coupled with the clock pulse signal and its drain terminal is used as an output terminal.

3 Claims, 3 Drawing Sheets

TRUE TYPE SINGLE-PHASE SHIFT CIRCUIT

TECHNICAL BACKGROUND

The present invention relates generally to a true type single-phase shift circuit and more particularly to a single-phase shift circuit that enhances the adaptability of a circuit to an incoming clock pulse whose rise and fall time may not perfectly match the strict requirements of a conventional single-phase shift circuit, and whose schematic circuit layout is more concise in design.

FIG. 1 is a schematic circuit diagram of a prior art CMOS true type single-phase shift circuit published in the IEEE Journal of Solid-Circuits, Feb. 1989, by Jiren Yuan and Christer Svensson; wherein, FIG. 1(a) is a schematic circuit diagram of a true single-phase, positive-edge-triggered shift circuit (tspps) 1 and FIG. 1(b) is a schematic circuit diagram of a true single-phase, negative-edge-triggered shift circuit (TSPPS) 2. The prior art CMOS true single-phase shift circuits, 1 and 2, are cascaded in three sections, a first section 12, a second section 14, and a third section 16, each section including three MOS transistors.

Shift circuit 1 includes PMOS transistor 122, 142, 162, and 124; and NMOS transistors 126, 146, 166, 144, and 164. The gates of PMOS transistor 122 and the gate of NMOS transistor 126 are connected to a data signal D; the gates of PMOS transistors 124, 142 and the gates of NMOS transistors 146, 164 are connected to the clock pulse signal C; and the drains of PMOS transistor 162 and the drain of NMOS transistor 164 are coupled to output terminal Q.

Shift circuit 2 is similar to shift circuit 1 except that PMOS 124, NMOS 144, and NMOS 164 are replaced by NMOS 224, PMOS 244, and PMOS 264; and the output terminal Q of shift circuit 2 is coupled to PMOS 264 and NMOS 166. In order to simplify the denotation, all the remaining transistors in FIG. 1(a) and 1(b) are labelled with corresponding numbers.

In the prior art shifters, second section 14 normally performs pre-charge or pre-discharge. Consequently, the rise and fall time of a clock pulse is critical to the proper functioning of the prior art shifters. For example, as seen in Table 1, a shift register using the shifters of the prior art (as in FIG. 4) cannot function properly if the rise and fall time of its clock pulse is longer than 0.8 ns. This restriction on the clock pulse not only limits the usefulness of prior art shifters 1, 2, but also complicates the circuit design.

SUMMARY OF THE INVENTION

This invention provides a true single-phase shift circuit that enhances the adaptability of the circuit to an incoming clock pulse whose rise and fall time may not perfectly match the strict requirements of a conventional single-phase shift circuit, and whose schematic circuit layout is more compact in design.

The true type single-phase shift circuit of the invention includes a first PMOS transistor having a source terminal coupled to a first electric potential, a drain terminal, and a gate terminal coupled to a data signal; a first NMOS transistor having a source terminal coupled to a second electric potential, a drain terminal and a gate terminal coupled to the data signal; two first type MOS transistors serially coupled between the drain terminal of the first PMOS transistor and the drain of the first NMOS transistor, wherein each of the two first type MOS transistors has a gate terminal coupled to a clock pulse signal; a second PMOS transistor having a source terminal coupled to the first electric potential, a drain terminal, and a gate terminal coupled between the two first type MOS transistors; a second NMOS transistor having a source terminal coupled to the second electric potential source, a drain terminal, and a gate terminal coupled between the two first type MOS transistors; a second type MOS transistors serially coupled between the drain terminal of the second PMOS transistor and the drain terminal of the second NMOS transistor, having a gate terminal coupled with the clock pulse signal, and a drain terminal used as an output terminal.

BRIEF DESCRIPTION OF THE DRAWINGS

The present invention can be more fully understood by reference to the following detailed description and accompanying drawings, which form an integral part of this application, and wherein.

DESCRIPTION OF THE PREFERRED EMBODIMENT

Figure 3B:
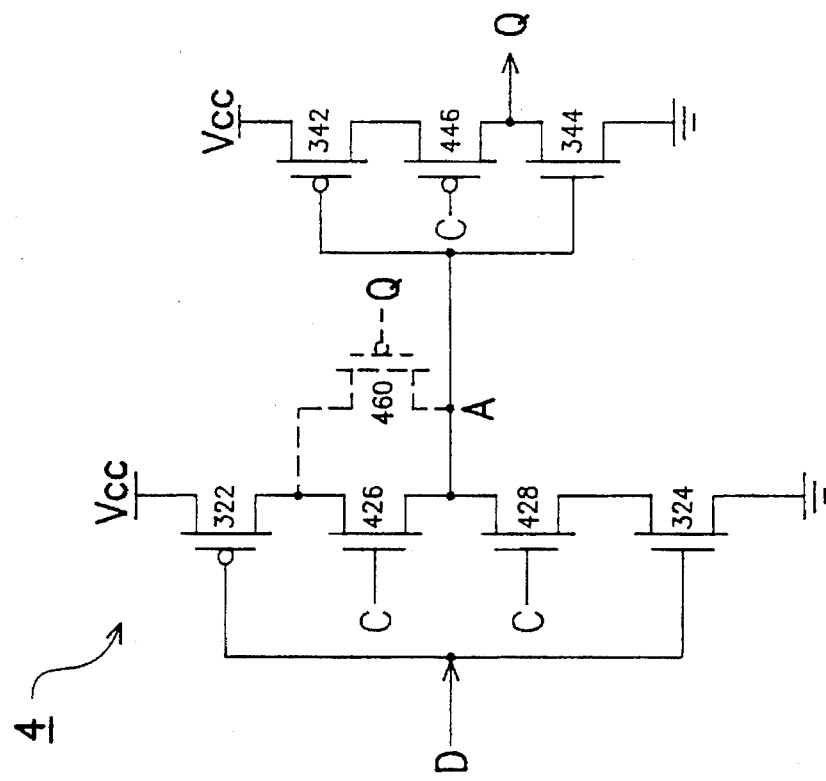
FIG. 3b is a circuit schematic diagram of a true single-phase negative edge-triggered shift circuit (TSPPS) of this invention.
Figure 3A:
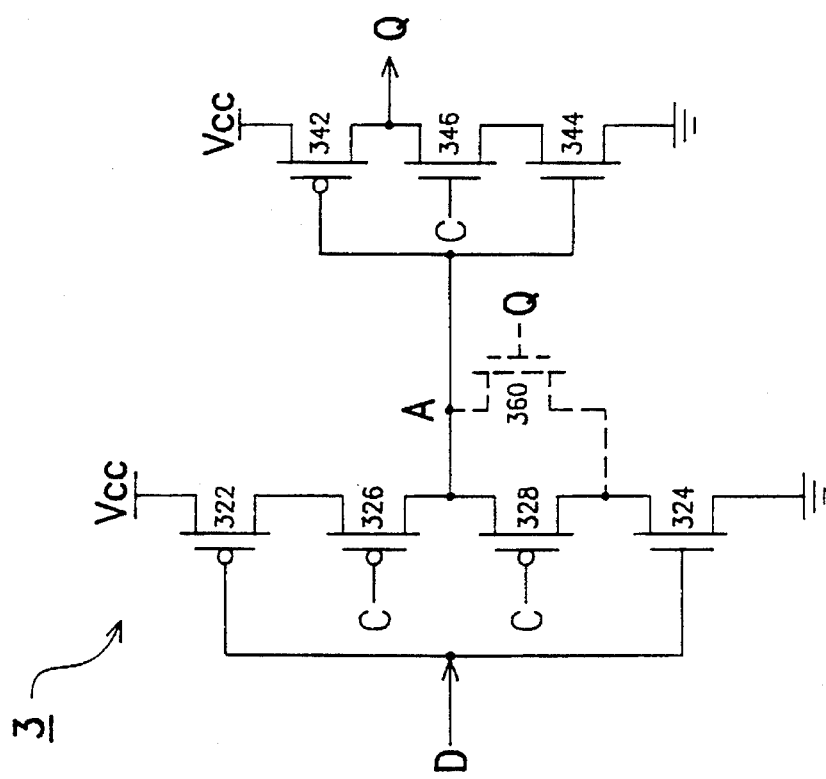
FIG. 3a is a circuit schematic diagram of a true single-phase positive edge-triggered shift circuit (TSPPS) of this invention.

FIG. 3a is a schematic diagram of a single-phase positive-edge-triggered shift circuit 3 according to a preferred embodiment of the present invention utilizes a first voltage potential (Vcc), a second voltage potential (ground), and a clock pulse C which triggers the actions of storing data D and outputting Q. The single-phase positive edge-triggered shift circuit 3 includes: a first PMOS transistor 322; a first NMOS transistor 324; two first-type MOS transistors 326, 328 (in the present embodiment, they are PMOS); a second PMOS transistor 342; a second NMOS transistor 344; and a second-type MOS transistor 346 (in the preferred embodiment, NMOS).

The first PMOS transistor 322 has a source terminal coupled to the first voltage potential and a gate terminal coupled to a data signal D.

The first NMOS transistor 324 has a source terminal coupled to the second voltage potential and a gate terminal coupled to the data signal D.

The first-type (P)MOS transistors 326, 328 connected between the drain terminal of PMOS 322 and the drain terminal of first NMOS 324 have their gate terminals coupled to a clock pulse signal C.

The MOS transistors 322, 324, 326, and 328 constitute the first section of the circuit configuration.

The second PMOS transistor 342 has a source terminal coupled to the first voltage potential and a gate terminal coupled to a node between PMOS transistors 326 and 328.

The second NMOS transistor 344 has a source terminal connected to the second voltage potential and a gate terminal coupled to the node between PMOS transistors 326 and 328.

The second-type (N)MOS transistor 346 connected between the drain terminal of PMOS 342 and the drain terminal of second NMOS 344 has a gate terminal coupled to the clock pulse signal C and a drain terminal coupled to an output terminal Q.

The MOS transistors 342, 344, and 346 constitute a second section of the circuit configuration.

The first-type transistor 326 or 328, for example, PMOS 328, is connected in parallel with NMOS transistor 360 whose gate terminal is coupled to output terminal Q.

In FIG. 3(a), when the clock pulse signal C is low (0), PMOS 326 and 328 are on while NMOS 346 is cut off, then Data D is inverted at node A; when the clock pulse is high (1), PMOS 326 and 328 are cut off while NMOS 346 is on, then data D is passed from node A and output through Q. At this time, any change of input cannot affect the output; therefore, a stable state is maintained, and the shifter of this invention does not need pre-charge or pre-discharge.

Moreover, because the MOS 328 is a PMOS transistor, the voltage at node A can never drop to low (0). However, the voltage potential may be discharged to low (0) through a feedback NMOS 360. Thus, this invention is not only immune from noise or interference, but also is more tolerant toward an imperfect clock pulse (ie, rise and fall time being out of the required range).

FIG. 3b is a schematic circuit diagram of a single-phase negative edge-triggered shift circuit 4 according to a preferred embodiment of the present invention, wherein NMOS transistors 426, 428, and PMOS transistors 446, 460 replace the NMOS transistors 346, 360, and PMOS transistors 326, 328 of the single-phase positive edge-triggered shift circuit 3 of this invention, as described previously with respect to FIG. 3. Except for those transistors described above, the remaining transistors are the same, and therefore are labelled with corresponding numerals in order to simplify the denotation. Likewise, except for being triggered by the negative edge of clock pulse signal D instead of the positive edge, this single-phase negative edge-triggered shift circuit 4 is similar to the positive edge-triggered shift circuit 3 in embodiment, therefore there is no need to repeat the details of circuit behavior.

Figure 1B:
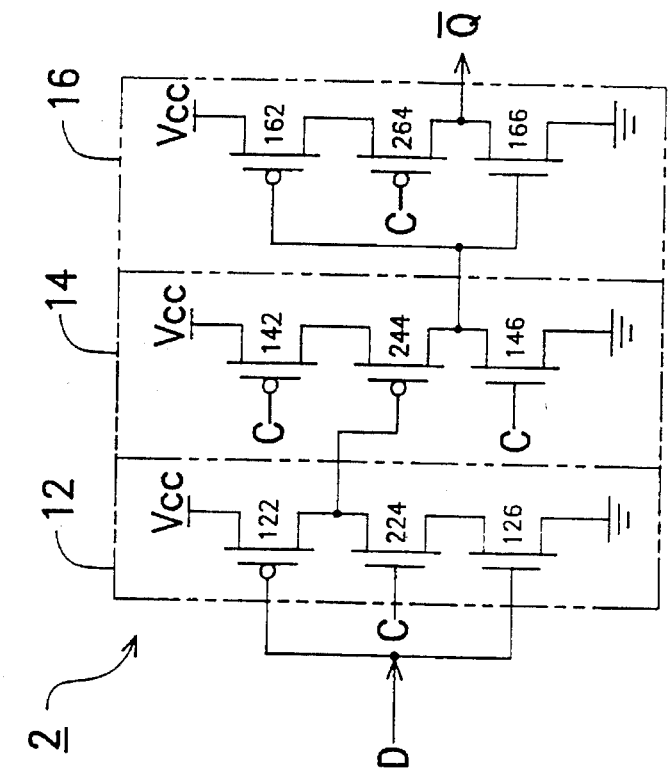
FIG. 1b is a circuit schematic diagram of a prior art true single-phase, negative edge-triggered shift circuit (TSPPS)
Figure 1A:
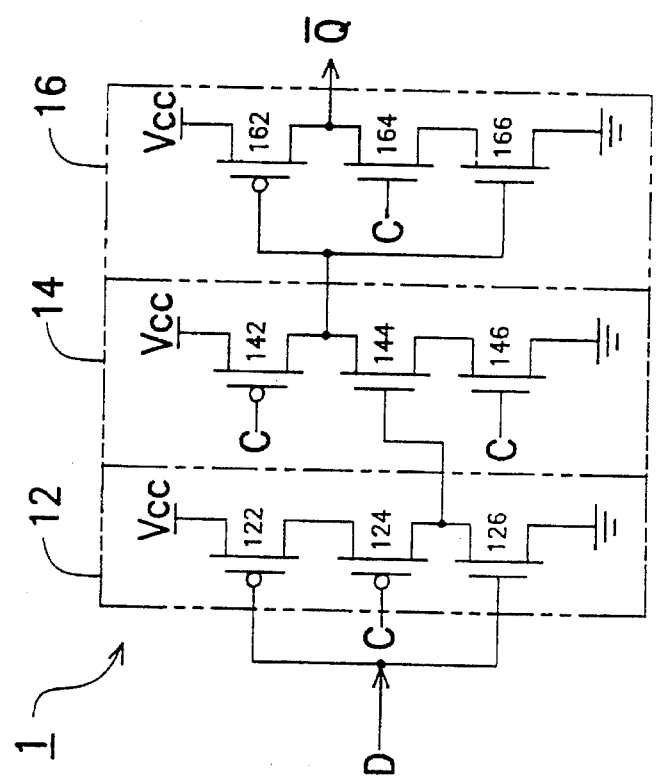
FIG. 1a is a circuit schematic diagram of a prior art true single-phase positive edge-triggered shift circuit (TSPPS)
Figure 2:
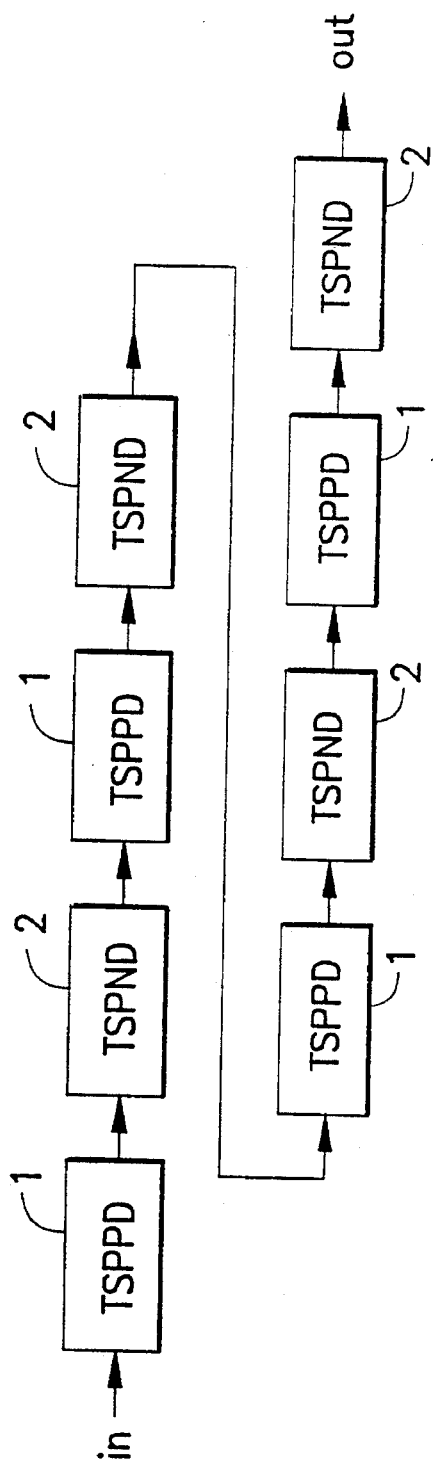
FIG. 2 is a signal-flow block diagram of a prior art shift register including (TSPPS) and (TSPPS) devices as shown in FIG. 1a and FIG. 1b.
Figure 4:
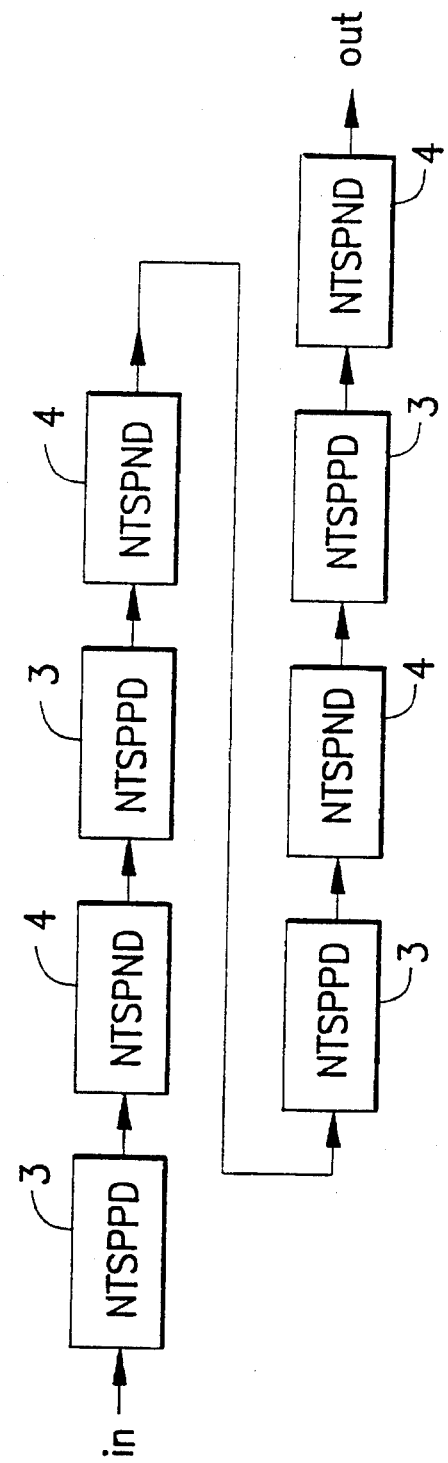
FIG. 4 is a signal-flow block diagram of a shift register including (TSPPS) and (TSPPS) devices as shown in FIG. 1a and FIG. 1b, wherein, the preceding letter "N" stands for "new" devices, ie.,"NTSPPS" meaning new TSPPS.

Table 1 shows the results of a SPICE simulation for a shift register, including prior art shifters 1, 2, as shown in FIG. 2, and a shift register including shifters 3, 4 of the present invention, as shown in FIG. 4. This SPICE simulation uses 0.8 μm CMOS parameter. The transistors are all of the same length (0.8 μm). But the width varies as follows:

In FIG. 1a, transistors 142, 162 have width of 6 microns; transistors 122, 124 have width of 12 microns; transistors 144, 146, 164, 166 have width of 4 microns; and transistors 126 have width of 2 microns.

In FIG. 1b, transistors 142, 162, 224, 264 have width of 12 microns; transistors 146, 166 have width of 2 microns; transistors 224, 126 have width of 4 microns; and transistors 122 have width of 6 microns.

In FIG. 3a, transistors 322, 326, 342, 328 have width of 6 microns; transistors 346, 344 have width of 4 microns; transistors 324, and feedback transistor 360 have width of 2 microns.

In FIG. 3b, transistors 322 and feedback transistor 460 have width of 6 microns; transistors 342, 446 have width of 12 microns; transistors 324, 344, 426, 428 have width of 2 microns.

In the design layout of the preferred embodiment, the ratio between PMOS and NMOS is about 3:1.

TABLE 1

| | the result of SPICE simulation | | |
|---|---|---|---|
| | shift register of FIG. 2 | shift register of FIG. 3 | shift register of FIG. 4 |
| allowable maximum rise and fall time | 0.8 ns | 3.5 ns | 5.5 ns |
| max. operating frequency | 0.6 GHz | 0.6 GHz | 0.6 GHz |
| No. of Transistors | 9 | 7 | 8 |

According to Table 1, the allowable maximum rise and fall time of shift registers using the shifters of this invention is 3.5 nsec (without feedback) or 5.5 nsec (with feedback) which is much better than the prior art shifter time (0.8 nsec). In addition, the new design uses fewer transistors.

As mentioned earlier, this invention has the advantage of improved rise/fall time tolerance because pre-charge/predischarge is eliminated, and has greater noise tolerance because feedback MOS transistors are used.

The invention has been described above in terms of some important, preferred embodiments; however, this invention is not limited to the disclosed embodiments. On the contrary, for a person skilled in the art, it is intended to cover various modifications and similar arrangements included within the spirit and scope of the appended claims, the scope of which should be accorded the broadest possible interpretation so as to encompass all such modifications and similar structures and processes.

What is claimed:

1. A true type single-phase shift circuit utilizing a first electric potential, a second electric potential that is lower than said first electric potential, and a clock pulse as a triggering signal for storing and outputting a data signal; comprising:

a first PMOS transistor having a source terminal coupled to said first electric potential source, a drain terminal, and a gate terminal coupled to said data signal;

a first NMOS transistor having a source terminal coupled to said second electric potential, a drain terminal and a gate terminal coupled to said data signal;

two first-type MOS transistors serially coupled between said drain terminal of said first PMOS transistor and said drain of said first NMOS transistor wherein each of said two first-type MOS transistors has a gate terminal coupled to said clock pulse signal;

a second PMOS transistor having a source terminal coupled to said first electric potential, a drain terminal, and a gate terminal connected between said two first-type MOS transistors;

a second NMOS transistor having a source terminal coupled to said second electric potential source, a drain terminal, and a gate terminal coupled between said two first-type MOS transistors;

a second-type MOS transistor serially coupled between said drain terminal of said second PMOS transistor and said drain terminal of said second NMOS transistor having a gate terminal coupled to said clock pulse signal, and a drain terminal used as an output terminal, wherein one of said first-type MOS transistors is coupled in parallel with a feedback second-type transistor having a gate terminal coupled to said output terminal.

2. The true type single-phase shift circuit as claimed in claim 1, wherein said first-type MOS transistor is PMOS, and said second-type MOS transistor is NMOS.

3. The true type single-phase shift circuit as claimed in claim 1, wherein said first-type MOS transistor is NMOS, and said second-type MOS transistor is PMOS.

* * * * *